United States Patent
Fujino

(10) Patent No.: US 11,908,596 B2
(45) Date of Patent: Feb. 20, 2024

(54) TRANSPARENT CONDUCTIVE LAYER, TRANSPARENT CONDUCTIVE SHEET, TOUCH SENSOR, LIGHT CONTROL ELEMENT, PHOTOELECTRIC CONVERSION ELEMENT, HEAT RAY CONTROL MEMBER, ANTENNA, ELECTROMAGNETIC WAVE SHIELD MEMBER, AND IMAGE DISPLAY DEVICE

(71) Applicant: NITTO DENKO CORPORATION, Ibaraki (JP)

(72) Inventor: Nozomi Fujino, Osaka (JP)

(73) Assignee: NITTO DENKO CORPORATION, Ibaraki (JP)

( * ) Notice: Subject to any disclaimer, the term of this patent is extended or adjusted under 35 U.S.C. 154(b) by 0 days.

(21) Appl. No.: 17/797,027

(22) PCT Filed: Jan. 29, 2021

(86) PCT No.: PCT/JP2021/003399
§ 371 (c)(1),
(2) Date: Aug. 2, 2022

(87) PCT Pub. No.: WO2021/157494
PCT Pub. Date: Aug. 12, 2021

(65) Prior Publication Data
US 2023/0077089 A1 Mar. 9, 2023

(30) Foreign Application Priority Data

Feb. 3, 2020 (JP) .................................. 2020-016509

(51) Int. Cl.
*H01B 5/14* (2006.01)
*H01B 1/08* (2006.01)
*C23C 14/08* (2006.01)

(52) U.S. Cl.
CPC ................. *H01B 5/14* (2013.01); *H01B 1/08* (2013.01); *C23C 14/08* (2013.01)

(58) Field of Classification Search
CPC .............. H01B 5/14; H01B 1/08; C23C 14/08
(Continued)

(56) References Cited

U.S. PATENT DOCUMENTS

2011/0084264 A1    4/2011  Yamazaki et al.
2011/0273085 A1*  11/2011  Garbar ................ H01L 31/1884
                                             977/773
(Continued)

FOREIGN PATENT DOCUMENTS

CN    103632753 A    3/2014
CN    106460161 A    2/2017
(Continued)

OTHER PUBLICATIONS

Office Action dated Sep. 21, 2021, issued in counterpart JP application No. 2021-517076, with English translation. (6 pages).
(Continued)

*Primary Examiner* — Tri V Nguyen
(74) *Attorney, Agent, or Firm* — WHDA, LLP

(57) ABSTRACT

A transparent conductive layer 3 includes a first main surface 5 exposed to the outside, and a second main surface 6 opposite to the first main surface 5 in a thickness direction. The transparent conductive layer 3 is single layer extending in a plane direction. The transparent conductive layer 3 has a first grain boundary 7 in which two end edges 23 in a cross-sectional view are open to the first main surface 5, and an intermediate region 25 between both end edges 23 is not in contact with the second main surface 6, and has a first crystal grain 31 partitioned by the first grain boundary 7 and facing only the first main surface 5.

10 Claims, 8 Drawing Sheets

(58) Field of Classification Search
USPC .......................................................... 428/412
See application file for complete search history.

(56) References Cited

U.S. PATENT DOCUMENTS

| | | |
|---|---|---|
| 2012/0114923 A1 | 5/2012 | Haishi et al. |
| 2014/0102764 A1 | 4/2014 | Fujino et al. |
| 2019/0334042 A1 | 10/2019 | Hala et al. |

FOREIGN PATENT DOCUMENTS

| | | | |
|---|---|---|---|
| JP | H07-73738 A | | 3/1995 |
| JP | 2000222944 A | | 8/2000 |
| JP | 2002151716 A | * | 5/2002 |
| JP | 2007227532 A | | 9/2007 |
| JP | 2008-149681 A | | 7/2008 |
| JP | 2011-23444 A | | 2/2011 |
| JP | 2011-100979 A | | 5/2011 |
| JP | 2012-188711 A | | 10/2012 |
| JP | 2013-1009 A | | 1/2013 |
| JP | 2017-188447 A | | 10/2017 |
| JP | 2018-41059 A | | 3/2018 |

OTHER PUBLICATIONS

Notification Concerning Transmittal of International Preliminary Report on Patentability (Form PCT/IB/326) issued in counterpart International Application No. PCT/JP2021/003399 dated Aug. 18, 2022 with Forms PCT/IB/373, PCT/IB/338 and PCT/ISA/237. (12 pages).
Office Action dated Jan. 5, 2023, issuedi n counterpart CN application No. 202180012533.x with English translation. (14 pages).
Office Action dated Oct. 28, 2023, issued in counterpart CN application No. 202180012533.X, with English translation. (14 pages).

* cited by examiner

TRANSPARENT CONDUCTIVE LAYER, TRANSPARENT CONDUCTIVE SHEET, TOUCH SENSOR, LIGHT CONTROL ELEMENT, PHOTOELECTRIC CONVERSION ELEMENT, HEAT RAY CONTROL MEMBER, ANTENNA, ELECTROMAGNETIC WAVE SHIELD MEMBER, AND IMAGE DISPLAY DEVICE

TECHNICAL FIELD

The present invention relates to a transparent conductive layer, a transparent conductive sheet, a touch sensor, a light control element, a photoelectric conversion element, a heat ray control member, an antenna, an electromagnetic wave shield member, and an image display device.

BACKGROUND ART

Conventionally, a transparent conductive sheet including a crystalline transparent conductive layer has been known.

For example, a light-transmitting conductive film including a light-transmitting conductive layer having a plurality of crystal grains has been proposed (ref: for example, Patent Document 1 below).

In the light-transmitting conductive layer described in Patent Document 1, there are grain boundaries for partitioning the above-described plurality of crystal grains extending from the upper surface to the lower surface of the light-transmitting conductive layer.

Further, the light-transmitting conductive layer of Patent Document 1 is formed into a wiring pattern by etching.

CITATION LIST

Patent Document

Patent Document 1: Japanese Unexamined Patent Publication No. 2018-41059

SUMMARY OF THE INVENTION

Problem to be Solved by the Invention

The light-transmitting conductive layer may be etched for reasons such as wiring pattern formation and design, and in recent years, the light-transmitting conductive layer is required to have a high etching rate for productivity improvement during etching steps. However, there is a problem that the light-transmitting conductive layer described in Patent Document 1 cannot satisfy the above-described demand.

The present invention provides a transparent conductive layer having a high etching rate, a transparent conductive sheet, a touch sensor, a light control element, a photoelectric conversion element, a heat ray control member, an antenna, an electromagnetic wave shield member, and an image display device.

Means for Solving the Problem

The present invention (1) includes a transparent conductive layer including a first main surface exposed to the outside, and a second main surface opposite to the first main surface in a thickness direction; being a single layer extending in a plane direction perpendicular to the thickness direction; and having a grain boundary in which two end edges in a cross-sectional view are open to the first main surface, and an intermediate region between both end edges is not in contact with the second main surface, and having a first crystal grain partitioned by the grain boundary and facing only the first main surface.

In the transparent conductive layer, when an etching solution is brought into contact with the first main surface, the etching solution easily enters the grain boundary from the two end edges, and therefore, the first crystal grain partitioned by the grain boundary is easily peeled off. As a result, an etching rate of the transparent conductive layer is high.

The present invention (2) includes the transparent conductive layer described in (1) further having a second grain boundary open to a side surface connecting one end edge of the first main surface to one end edge of the second main surface.

In the transparent conductive layer, when the etching solution is brought into contact with the side surface, the etching solution easily enters the second grain boundary, and therefore, the crystal grain partitioned by the second grain boundary is easily peeled off. As a result, the etching rate of the transparent conductive layer is further high.

The present invention (3) includes the transparent conductive layer described in (1) or (2), wherein a material for the transparent conductive layer is a tin-containing oxide.

Since the material for the transparent conductive layer is the tin-containing oxide, it has excellent transparency and electrical conductivity.

The present invention (4) includes a transparent conductive sheet including the transparent conductive layer described in any one of (1) to (3) and a substrate sheet located at the side of a second main surface of the transparent conductive layer.

The present invention (5) includes a touch sensor including the transparent conductive layer described in any one of (1) to (3).

The present invention (6) includes a light control element including the transparent conductive layer described in any one of (1) to (3).

The present invention (7) includes a photoelectric conversion element including the transparent conductive layer described in any one of (1) to (3).

The present invention (8) includes a heat ray control member including the transparent conductive layer described in any one of (1) to (3).

The present invention (9) includes an antenna including the transparent conductive layer described in any one of (1) to (3).

The present invention (10) includes an electromagnetic wave shield member including the transparent conductive layer described in any one of (1) to (3).

The present invention (11) includes an image display device including the transparent conductive layer described in any one of (1) to (3).

Effect of the Invention

The transparent conductive layer provided in the transparent conductive sheet, the touch sensor, the light control element, the photoelectric conversion element, the heat ray control member, the antenna, the electromagnetic wave shield member, and the image display device of the present invention has a high etching rate.

BRIEF DESCRIPTION OF THE DRAWINGS

FIG. 1A illustrating a step of preparing a substrate sheet,

FIG. 1B illustrating a step of forming an amorphous transparent conductive layer, and FIG. 1C illustrating a step of forming a crystalline transparent conductive layer.

DESCRIPTION OF EMBODIMENTS

Figure 1A:
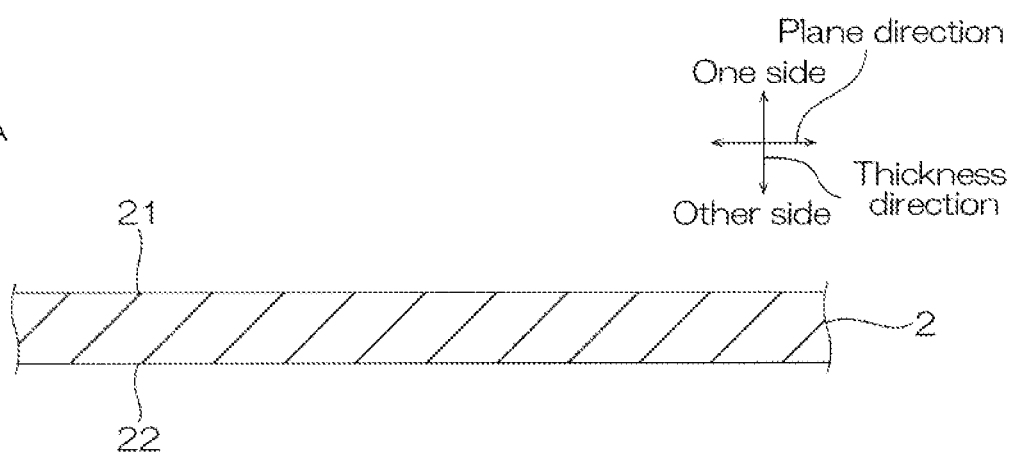
FIGS. 1A to 1C show process cross-sectional views for illustrating a method for producing one embodiment of a transparent conductive sheet of the present invention.
Figure 1B:
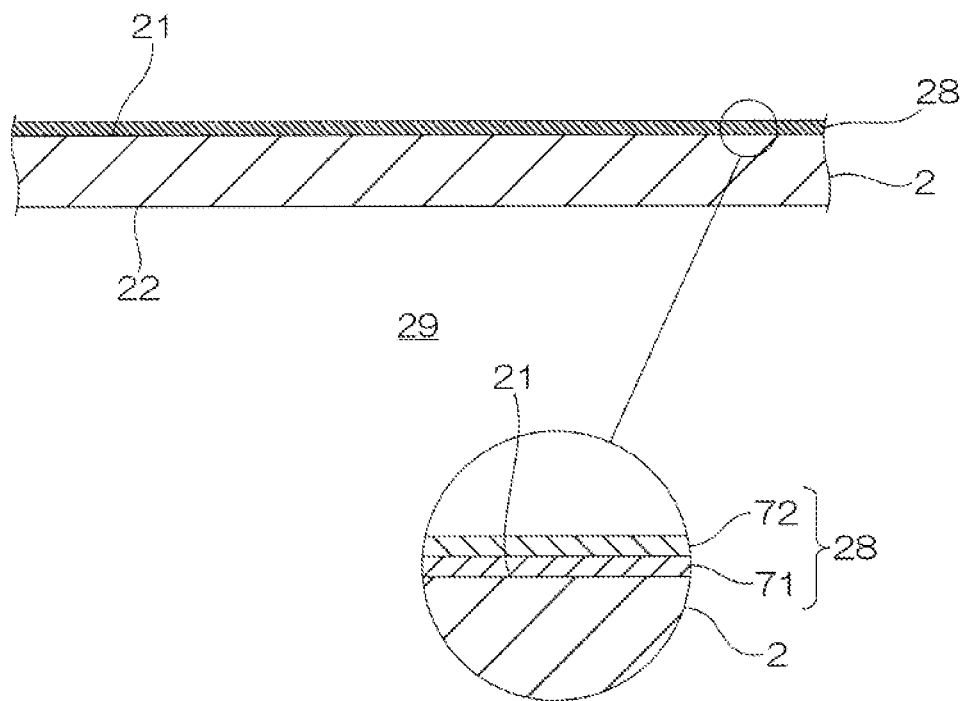

One embodiment of a transparent conductive sheet of the present invention is described with reference to FIGS. 1A to 3. In FIG. 2, a plurality of crystal grains 4 (described later) are drawn in grays having different density from each other in order to clearly show the plurality of crystal grains 4, and in order to distinguish a first grain boundary 7 (described later) to a third grain boundary 9 (described later) from a leader line.

Figure 1C:
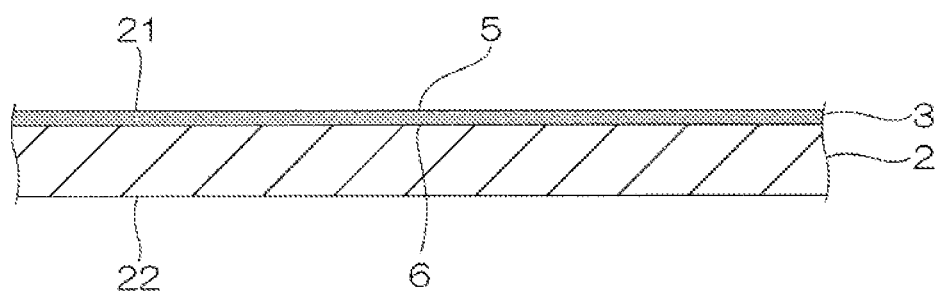
Figure 2:
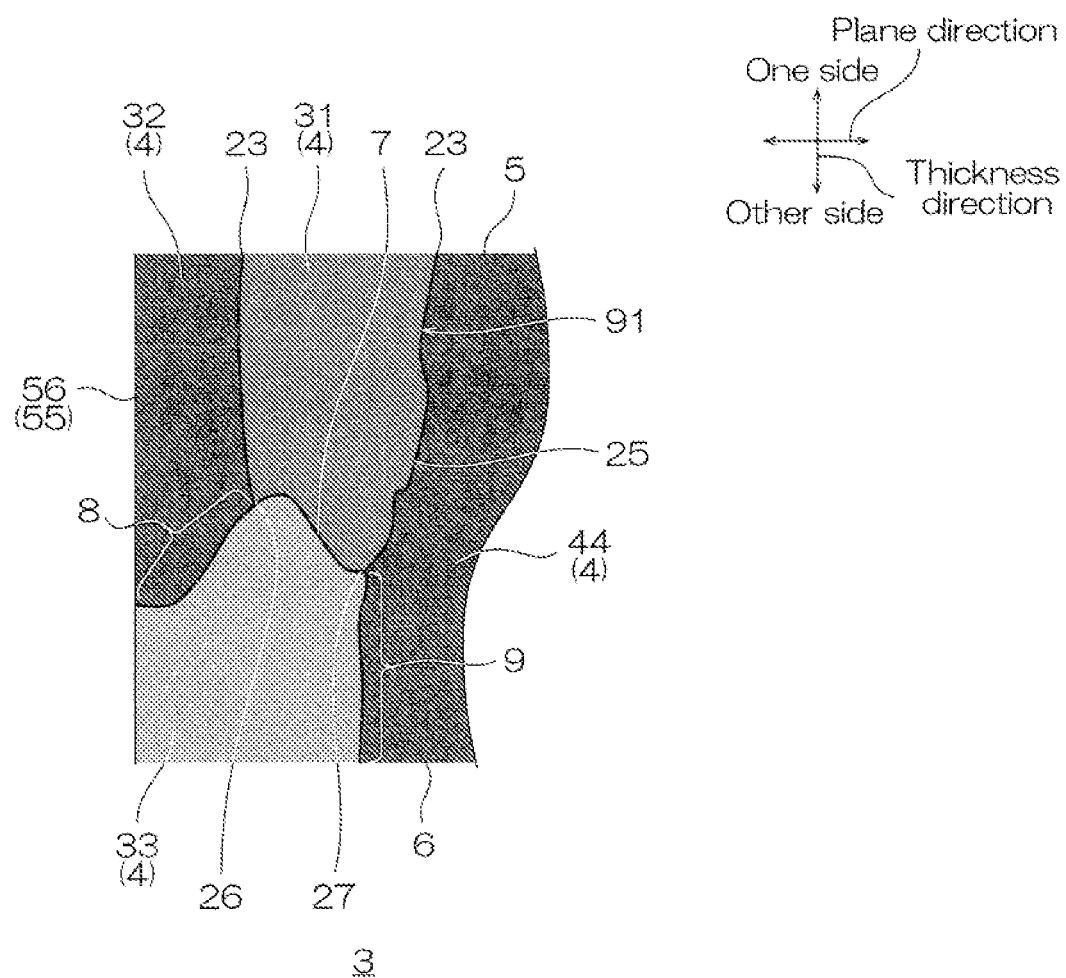
FIG. 2 shows an enlarged cross-sectional view of one end portion of the transparent conductive layer in the transparent conductive sheet shown in FIG. 1C.

As shown in FIG. 1C, a transparent conductive sheet 1 has a sheet shape having a predetermined thickness and extending in a plane direction perpendicular to a thickness direction. The transparent conductive sheet 1 includes a substrate sheet 2 and a transparent conductive layer 3 in order toward one side in the thickness direction.

The substrate sheet 2 is a transparent substrate for ensuring mechanical strength of the transparent conductive sheet 1. The substrate sheet 2 extends in the plane direction. The substrate sheet 2 has a substrate first main surface 21 and a substrate second main surface 22. The substrate first main surface 21 is a flat surface. The substrate second main surface 22 is oppositely disposed at spaced intervals to the other side in the thickness direction of the substrate first main surface 21. The substrate sheet 2 is located at the side of a second main surface 6 (described later) of the transparent conductive layer 3. The substrate second main surface 22 is parallel to the substrate first main surface 21.

The flat surface is not limited to a flat surface where the substrate first main surface 21 and the substrate second main surface 22 of the substrate sheet 2 are generally parallel. For example, fine irregularities and waviness to the extent that cannot be observed are acceptable.

Examples of a material for the substrate sheet 2 include polyester resins such as polyethylene terephthalate (PET), polybutylene terephthalate, and polyethylene naphthalate; (meth)acrylic resins (acrylic resin and/or methacrylic resin) such as polymethacrylate; olefin resins such as polyethylene, polypropylene, and cycloolefin polymer; polycarbonate resins; polyether sulfone resins; polyarylate resins; melamine resins; polyamide resins; polyimide resins; cellulose resins; polystyrene resins; and norbornene resins. From the viewpoint of transparency and moisture permeability resistance, preferably, a polyester resin is used, more preferably, PET is used. A thickness of the substrate sheet 2 is, for example, 10 µm or more, and for example, 100 µm or less.

The transparent conductive layer 3 is disposed on one side in the thickness direction of the substrate sheet 2. Specifically, the transparent conductive layer 3 is in contact with the entire substrate first main surface 21 of the substrate sheet 2. The transparent conductive layer 3 is a single layer having a predetermined thickness and extending in the plane direction. Specifically, the transparent conductive layer 3 is not a plurality of layers which are laminated in the thickness direction. More specifically, a plurality of transparent conductive layers partitioned along the plane direction, and including boundaries parallel to the substrate first main surface 21 of the substrate sheet 2 are not the transparent conductive layer of the present invention.

The transparent conductive layer 3 includes a first main surface 5, the second main surface 6, and a side surface 55 (ref: FIG. 2).

The first main surface 5 is exposed toward one side (outside) in the thickness direction. That is, the first main surface 5 is exposed to the atmosphere. The first main surface 5 is a flat surface.

The second main surface 6 is oppositely disposed at spaced intervals to the other side in the thickness direction of the first main surface 5. The second main surface 6 is a flat surface parallel to the first main surface 5. The second main surface 6 is in contact with the substrate first main surface 21.

The flat surface is not limited to a flat surface where the first main surface 5 and the second main surface 6 are generally parallel. For example, fine irregularities and waviness to the extent that cannot be observed are acceptable.

As shown in FIG. 2, the side surface 55 connects a peripheral end edge of the first main surface 5 to that of the second main surface 6. In a cross-sectional view, the side surface 55 has a one-side surface 56 connecting one end edge of the first main surface 5 to that of the second main surface 6, and an other-side surface (not shown) connecting the other end edge of the first main surface 5 to that of the second main surface 6.

The transparent conductive layer 3 is crystalline. Specifically, the transparent conductive layer 3 does not include an amorphous region, and includes only a crystalline region in the plane direction. The transparent conductive layer 3 including the amorphous region is identified, for example, by observing crystal grains in the plane direction of the transparent conductive layer 3 with TEM.

When the transparent conductive layer 3 is crystalline, for example, the transparent conductive layer 3 is immersed in a hydrochloric acid aqueous solution of 5% by mass at 20° C. for 15 minutes, and thereafter, washed with water and dried. The resistance between two terminals between about 15 mm is measured in the first main surface 5, and the resistance between the two terminals is 10 kΩ or less. On the other hand, when the above-described resistance between the two terminals is above 10 kΩ, the transparent conductive layer 3 is amorphous.

The transparent conductive layer 3 has the plurality of crystal grains 4. The crystal grains 4 may be also referred to as grains. The crystal grain 4 includes a first crystal grain 31 partitioned by the first grain boundary 7 as one example of a grain boundary.

The first crystal grain 31 does not face the second main surface 6 and the side surface 55, and faces the first main surface 5. That is, the first crystal grain 31 faces only the first main surface 5.

The first grain boundary 7 includes two end edges 23. Further, the two end edges 23 are open to the first main surface 5. In the first grain boundary 7, an intermediate region 25 between both end edges 23 is not in contact with the second main surface 6 and the side surface 55. The first grain boundary 7 has, in a cross-sectional view, a generally U-shape which is open toward one side in the thickness direction. Further, the first grain boundary 7 has a path of proceeding from the one end edge 23 toward the other side in the thickness direction, proceeding in a width direction (one example of a direction perpendicular to the thickness direction) in a middle portion in the thickness direction, and thereafter, returning to the other end edge 23 toward a one surface-side in the thickness direction. The first grain boundary 7 may also have a path of proceeding from the one end edge 23 toward the other side in the thickness direction, folding back in the middle portion in the thickness direction, and then, returning to the other end edge 23 toward the one surface-side in the thickness direction.

Although not shown, the plurality of first crystal grains 31 may be also provided in the transparent conductive layer 3. In this case, the one end edges 23 of the first crystal grains 31 adjacent to each other may be common.

Further, in this embodiment, the intermediate region 25 of the first grain boundary 7 includes a first branch point 26 and a second branch point 27.

The second grain boundary 8 branches from the first grain boundary 7 starting from the first branch point 26. One end edge of the second grain boundary 8 is included in the intermediate region 25, and the other end edge thereof is open to the one-side surface 56 (the side surface 55).

Then, a second crystal grain 32 is partitioned by the second grain boundary 8, and a portion reaching from the one end edge 23 to the middle portion of the intermediate region 25 in the first grain boundary 7.

The second crystal grain 32 does not face the second main surface 6, and faces the first main surface 5 and the one-side surface 56. That is, the second crystal grain 32 faces only the first main surface 5 and the one-side surface 56.

Further, the third grain boundary 9 branches from the first grain boundary 7 starting from the second branch point 27. One end edge of the third grain boundary 9 is included in the intermediate region 25, and the other end edge thereof is open to the second main surface 6. Then, a third crystal grain 33 is partitioned by the third grain boundary 9, the intermediate region 25 of the first grain boundary 7, and the second grain boundary 8.

The third crystal grain 33 does not face the first main surface 5, and faces the second main surface 6 and the one-side surface 56. That is, the third crystal grain 33 faces only the second main surface 6 and the one-side surface 56.

Further, the transparent conductive layer 3 may also include a fourth crystal grain 44 facing both the first main surface 5 and the second main surface 6.

The transparent conductive layer 3 may be a crystalline layer containing the first crystal grain 31, and an abundance ratio of the first crystal grain 31 to the other crystal grains such as the second crystal grain 32, the third crystal grain 33, and the fourth crystal grain 44 is arbitrary.

A material for the transparent conductive layer 3 is not particularly limited. An example of the material for the transparent conductive layer 3 includes a metal oxide containing at least one kind of metal selected from the group consisting of In, Sn, Zn, Ga, Sb, Nb, Ti, Si, Zr, Mg, Al, Au, Ag, Cu, Pd, and W. Specifically, preferably, metal oxides such as indium-zinc composite oxide (IZO), indium-gallium-zinc composite oxide (IGZO), indium-gallium composite oxide (IGO), indium-tin composite oxide (ITO), and antimony-tin composite oxide (ATO) are used, preferably, tin-containing oxides such as indium-tin composite oxide (ITO) and antimony-tin composite oxide (ATO) are used. When the material for the transparent conductive layer 3 is the tin-containing oxide, it has excellent transparency and electrical conductivity.

The tin oxide ($SnO_2$) content of the transparent conductive layer 3 (tin-containing oxide) is not particularly limited, and is, for example, 0.5% by mass or more, preferably 3% by mass or more, more preferably 6% by mass or more, and for example, below 50% by mass, preferably 25% by mass or less, more preferably 15% by mass or less.

The thickness of the transparent conductive layer 3 is, for example, 10 nm or more, preferably 30 nm or more, more preferably 70 nm or more, further more preferably 100 nm or more, particularly preferably 120 nm or more, most preferably 140 nm or more, and for example, 300 nm or less, preferably 200 nm or less. A method for determining the thickness of the transparent conductive layer 3 is described in detail in Examples later.

A ratio of a length (average of the length in the case of the plurality of first crystal grains 31) between the two end edges 23 in a cross-sectional view to the thickness of the transparent conductive layer 3 is, for example, 0.1 or more, preferably 0.25 or more, and for example, 20 or less, preferably 10 or less, more preferably 5 or less, further more preferably 3 or less. When the above-described ratio is above the above-described lower limit and below the above-described upper limit, it is possible to increase the etching rate of the transparent conductive layer 3.

The maximum crystal grain size in the plurality of crystal grains 4 is not particularly limited, and is, for example, 500 nm or less, preferably 400 nm or less, more preferably 350 nm or less, further more preferably 300 nm or less, particularly preferably 250 nm or less, most preferably 220 nm or less, and for example, 1 nm or more, preferably 10 nm or more. When the maximum crystal grain size in the plurality of crystal grains 4 is the above-described upper limit or less, it is possible to increase an amount of the first grain boundary 7 in the unit area in the first main surface 5 of the transparent conductive layer 3, and therefore, it is possible to increase the etching rate. The method for determining the maximum crystal grain size in the plurality of crystal grains 4 is described in detail in Examples later.

The surface resistance of the transparent conductive layer 3 is, for example, 200 Ω/□ or less, preferably 50 Ω/□ or less, more preferably 30 Ω/□ or less, further more preferably 20 Ω/□ or less, particularly preferably 15 Ω/□ or less, and for example, above 0 Ω/□.

The total light transmittance of the transparent conductive layer 3 is, for example, 50% or more, preferably 75% or more, more preferably 80% or more, further more preferably 83% or more, particularly preferably 90% or more, and for example, 100% or less.

Next, a method for producing the transparent conductive sheet 1 is described.

In this method, for example, the transparent conductive layer 3 is formed, while the substrate sheet 2 is conveyed by a roll-to-roll method.

As shown in FIG. 1A, specifically, first, the substrate sheet 2 is prepared.

As shown in FIG. 1C, next, the transparent conductive layer 3 is formed on the substrate first main surface 21 of the substrate sheet 2. The transparent conductive layer 3 is, for example, formed by a dry method such as sputtering and by a wet method such as plating. The transparent conductive layer 3 is formed preferably by a dry method, more preferably by sputtering.

Figure 3:
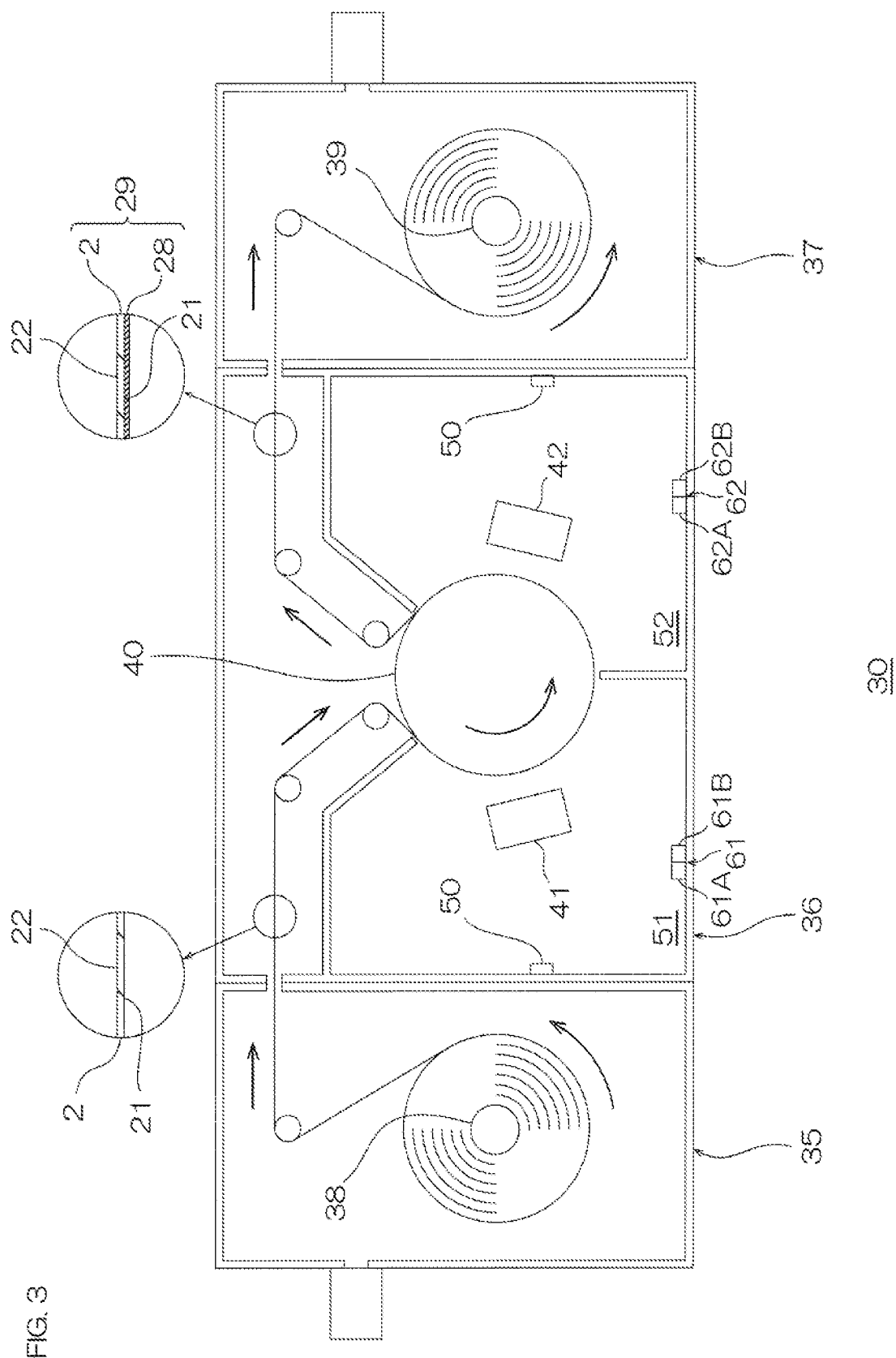
FIG. 3 shows a schematic view of a sputtering device used in the step of forming the amorphous transparent conductive layer shown in FIG. 1B.

A method for producing the transparent conductive layer 3 is not particularly limited. For example, an amorphous transparent conductive layer 28 shown in FIG. 1B is formed using a sputtering device 30 (ref: FIG. 3) including a film-forming roll 40 including a cooling device (not shown), and thereafter, the amorphous transparent conductive layer 28 is heated.

As shown in FIG. 3, the sputtering device 30 includes a feeding portion 35, a sputtering portion 36, and a take-up portion 37 in order from an upstream side toward a downstream side in a conveying direction of the substrate sheet 2.

The feeding portion 35 includes a feeding roll 38.

The sputtering portion 36 includes a film-forming roll 40 and a plurality of targets 41 to 42.

The film-forming roll 40 includes a cooling device, which is not shown, configured to cool the film-forming roll 40.

The plurality of targets 41 to 42 consist of the first target 41 and the second target 42. The first target 41 to the second target 42 are disposed in order along a circumferential direction of the film-forming roll 40.

As the material for the targets 41 to 42, the same material as that of the above-described transparent conductive layer 3 is used.

Each of the plurality of targets 41 to 42 is housed in each of a plurality of film-forming chambers 51 to 52.

The plurality of film-forming chambers 51 to 52 consist of the first film-forming chamber 51 and the second film-forming chamber 52. The first film-forming chamber 51 to the second film-forming chamber 52 are disposed adjacent to each other along the circumferential direction.

Each of the plurality of film-forming chambers 51 to 52 is provided with each of a plurality of gas feeders 61 to 62. The plurality of gas feeders 61 to 62 correspond to the respective plurality of targets 41 to 42. The plurality of gas feeders 61 to 62 consist of the first gas feeder 61 and the second gas feeder 62. Each of the plurality of gas feeders 61 to 62 is capable of supplying a sputtering gas to each of the plurality of film-forming chambers 51 to 52.

Specifically, each of the plurality of gas feeders 61 to 62 includes each of inert gas feeders 61A to 62A and each of oxygen gas feeders 61B to 62B.

The inert gas feeders 61A to 62A consist of the first inert gas feeder 61A and the second inert gas feeder 62A. The first inert gas feeder 61A to the second inert gas feeder 62A are capable of supplying an inert gas to the film-forming chambers 51 to 52, respectively.

The oxygen gas feeders 61B to 62B consist of the first oxygen gas feeder 61B and the second oxygen gas feeder 62B. The first oxygen gas feeder 61B to the second oxygen gas feeder 62B are capable of supplying an oxygen gas to the film-forming chambers 51 to 52, respectively.

In addition, a pump 50 which is capable of reducing the pressure of each of the plurality of film-forming chambers 51 to 52 is provided in each of the plurality of film-forming chambers 51 to 52.

The take-up portion 37 includes a take-up roll 39.

In order to form (sputter) the amorphous transparent conductive layer 28 on the substrate first main surface 21 of the substrate sheet 2 using the sputtering device 30, first, the substrate sheet 2 is bridged over the feeding roll 38, the film-forming roll 40, and the take-up roll 39.

Further, by driving the cooling device, (the surface of) the film-forming roll 40 is cooled. A temperature (surface temperature) of the film-forming roll 40 is, for example, 10.0° C. or less, preferably 0.0° C. or less, more preferably −2.5° C. or less, further more preferably −5.0° C. or less, even more preferably −7.0° C. or less, and for example, −50° C. or more, preferably −20° C. or more, further more preferably −10° C. or more. When the temperature of the film-forming roll 40 is the above-described upper limit or less, it is possible to sufficiently cool the substrate sheet 2, and it is possible to form the first grain boundary 7 in the transparent conductive layer 3. Specifically, by not adding an excessive amount of heat at the time of film-formation of the transparent conductive layer 3, it is possible to suppress excessive growth of the crystal grain 4 in the thickness direction and the plane direction during conversion to crystalline properties. Therefore, the first grain boundary 7 is formed in the transparent conductive layer 3.

On the other hand, when the temperature of the film-forming roll 40 is the above-described lower limit or more, it is possible to form the amorphous transparent conductive layer 28 in which the amorphous transparent conductive layer is capable of being converted into the crystalline transparent conductive layer.

Further, the plurality of pumps 50 are driven to bring the first film-forming chamber 51 to the second film-forming chamber 52 into a vacuum state, and the sputtering gas is supplied from each of the first gas feeder 61 to the second gas feeder 62 to each of the first film-forming chamber 51 to the second film-forming chamber 52.

Examples of the sputtering gas include inert gases such as Ar, and preferably, a reactive gas obtained by mixing an inert gas and a reactive gas such as oxygen is used. In the case of the reactive gas, it is possible to control the crystal grain growth of the transparent conductive layer 3. The reactive gas is preferably a mixed gas of the inert gas and the oxygen gas.

The ratio (oxygen gas flow rate/inert gas flow rate) of the oxygen gas flow rate (mL/min) to the inert gas flow rate (mL/min) is, for example, 0.0001 or more, preferably 0.001 or more, and for example, below 0.5, preferably 0.1 or less, more preferably below 0.03, further more preferably 0.02 or less, particularly preferably 0.01 or less. When the above-described ratio is the above-described upper limit or less, the transparent conductive layer 3 having preferable resistance properties is obtained.

In the sputtering gas supplied from the plurality of gas feeders 61 to 62, the ratio (oxygen gas flow rate/inert gas flow rate) of the oxygen gas flow rate (mL/min) to the inert gas flow rate (mL/min) is the same or different. Preferably, the oxygen flow ratio in the oxygen gas supplied from the plurality of gas feeders 61 to 62 is different.

Specifically, a ratio R1 of the oxygen gas flow rate supplied from the first gas feeder 61 is higher than a ratio R2 of the oxygen gas flow rate supplied from the second gas feeder 62. Specifically, R1/R2 is, for example, 1.5 or more, preferably 2 or more, more preferably 3 or more, further more preferably 4 or more, and for example, 20 or less.

When R1 is higher than R2, the oxygen content of a region at the side of the second main surface 6 of the transparent conductive layer 3 is increased, the crystal growth of the region can be promoted, and the crystal grain 4 growing from the side of the first main surface 5 and the crystal grain 4 growing from the side of the second main surface 6 are easily formed independently. Therefore, it is possible to more reliably form the first grain boundary 7 in the transparent conductive layer 3.

Subsequently, by driving the take-up roll 39, the substrate sheet 2 is fed from the feeding roll 38. The substrate sheet 2 moves with respect to the first target 41 and the second target 42, while being in contact with the surface of the film-forming roll 40. At this time, the substrate sheet 2 is cooled by contact with the surface of the film-forming roll 40. In the present application, a cooling temperature of the substrate sheet 2 is substantially the same as the surface temperature of the film-forming roll 40.

Further, in the vicinity of each of the first target 41 to the second target 42, an ionized gas is produced by ionizing the sputtering gas. Subsequently, the ionized gas impinges on each of the first target 41 to the second target 42, the target material of each of the first target 41 to the second target 42 is ejected, and these target materials sequentially adhere to the substrate sheet 2.

The target material of the first target 41 adheres to the substrate first main surface 21 of the substrate sheet 2, preferably to the substrate first main surface 21 of the substrate sheet 2 which is cooled to the above-described temperature, and next, the target material of the second target 42 adheres thereto. That is, the target materials of the first target 41 to the second target 42 are deposited in order on the substrate first main surface 21 of the substrate sheet 2.

Thus, the amorphous transparent conductive layer 28 is formed on the substrate first main surface 21. Thus, an amorphous transparent conductive sheet 29 including the substrate sheet 2 and the amorphous transparent conductive layer 28 is obtained.

As shown by an enlarged view of FIG. 1B, the amorphous transparent conductive layer 28 includes a first region 71 made of the target material of the first target 41 and a second region 72 made of the target material of the second target 42 in order toward one side in the thickness direction.

In the enlarged view of FIG. 1B, in order to clearly show the relative arrangement of the first region 71 to the second region 72 adjacent to each other, their boundaries are shown. However, in the amorphous transparent conductive layer 28, the boundaries may not be clearly observed.

Next, the amorphous transparent conductive layer 28 is crystallized, thereby forming the crystalline transparent conductive layer 3.

In order to crystallize the amorphous transparent conductive layer 28, for example, the amorphous transparent conductive layer 28 is heated.

The heating conditions are not particularly limited. A heating temperature is, for example, below 200° C., preferably 180° C. or less, more preferably 170° C. or less, further more preferably 165° C. or less. The heating time is, for example, 1 minute or more, preferably 3 minutes or more, more preferably 5 minutes or more, and for example, 5 hours or less, preferably 3 hours or less, more preferably 2 hours or less. Also, the heating is carried out, for example, under an atmospheric atmosphere.

Thus, the amorphous transparent conductive layer 28 is converted into the transparent conductive layer 3 having the plurality of crystal grains 4.

Thus, the transparent conductive sheet 1 including the substrate sheet 2 and the transparent conductive layer 3 is obtained.

Then, the transparent conductive sheet 1 is formed into an appropriate pattern, specifically, an electrode pattern or the like by etching (specifically, wet etching using an etching solution). Thereafter, the patterned transparent conductive sheet 1 including the transparent conductive layer 3 is used for touch sensors, electromagnetic wave shields, light control elements (voltage-driven light control elements such as PDLC and SPD, and current-driven light control elements such as electrochromic (EC)), photoelectric conversion elements (solar cells represented by organic thin-film solar cells or dye-sensitized solar cells etc.), heat ray control members (near-infrared reflection and/or absorbing members or far-infrared reflection and/or absorbing members), antenna members (light-transmitting antennas), image display devices, or the like.

(Function and Effect of One Embodiment)

In the transparent conductive layer 3, when the etching solution is brought into contact with the first main surface 5, the etching solution easily enters the first grain boundary 7 from the two end edges 23, and therefore, the first crystal grain 31 partitioned by the first grain boundary 7 is easily etched. Specifically, since both end edges 23 of the first grain boundary 7 partitioning the first crystal grain 31 face the first main surface 5, when the etching solution enters the first grain boundary 7, the etching solutions from both end edges 23 merge in the intermediate region 25. The first crystal grain 31 is, for example, not supported by the third crystal grain 33 facing the second main surface 6, and easily etched (including missing and falling off) from the transparent conductive layer 3. As a result, in the transparent conductive sheet 1, the etching rate of the transparent conductive layer 3 is high.

Further, in the transparent conductive layer 3, when the etching solution is brought into contact with the one-side surface 56, the etching solution easily enters the second grain boundary 8. Therefore, the second crystal grain 32 partitioned by the second grain boundary 8 is easily peeled off. As a result, in the transparent conductive sheet 1, the etching rate of the transparent conductive layer 3 is further high.

(Modified Examples)

In each modified example below, the same reference numerals are provided for members and steps corresponding to each of those in the above-described one embodiment, and their detailed description is omitted. Each modified example can achieve the same function and effect as that of one embodiment unless otherwise specified. Furthermore, one embodiment and the modified example thereof can be appropriately used in combination.

In the above-described sputtering device 30, the number of the plurality of targets 41 to 42, the number of the plurality of film-forming chambers 51 to 52, and the number of the plurality of gas feeders 61 to 62 are 2. However, the number may be, for example, 3 or more. For example, when the above-described number is 3, in the step of forming the amorphous transparent conductive layer 28, the ratio of the oxygen gas flow rate to the inert gas flow rate supplied from the first gas feeder 61 is set higher than the ratio of the oxygen gas flow rate to the inert gas flow rate supplied from the second gas feeder 62, and further, the ratio of the oxygen gas flow rate to the inert gas flow rate supplied from the second gas feeder 62 is set higher than the ratio of the oxygen gas flow rate to the inert gas flow rate supplied from the third gas feeder 63. In the case where the above-described number is plural, in any adjacent gas feeders, the ratio of the oxygen gas flow rate to the inert gas flow rate supplied from one gas feeder is set higher than the ratio of the oxygen gas flow rate to the inert gas flow rate supplied from another gas feeder adjacent to the downstream side of the one gas feeder.

In this method, since the oxygen content of the region at the side of the second main surface 6 of the transparent conductive layer 3 is increased, the crystal growth of the region can be promoted, and the crystal grain 4 growing from the side of the first main surface 5 and the crystal grain 4 growing from the side of the second main surface 6 are easily formed independently. Therefore, it is possible to more reliably form the first grain boundary 7 in the transparent conductive layer 3.

Figure 4:
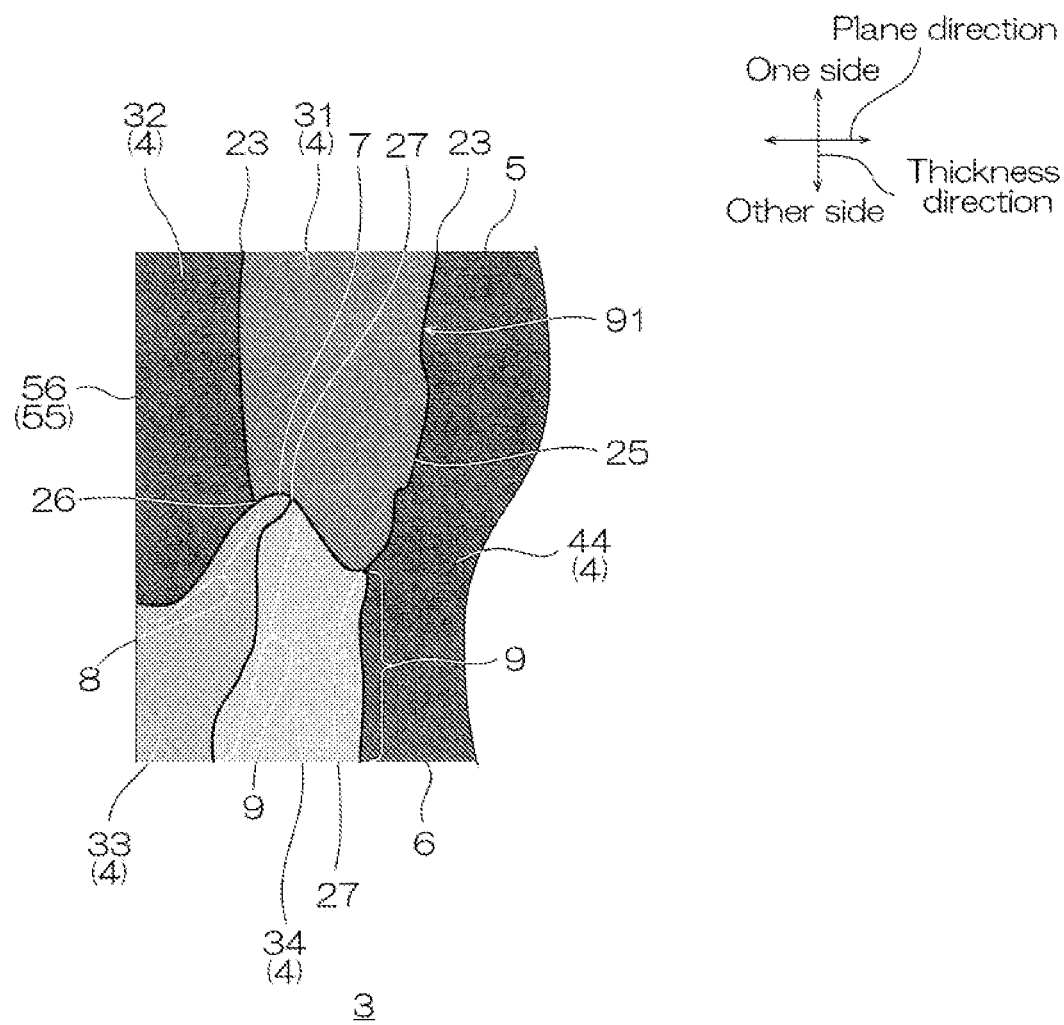
FIG. 4 shows a cross-sectional view of a modified example (modified example in which a fourth crystal grain is partitioned by two third grain boundaries) of a transparent conductive layer of the present invention.

Further, as shown in FIG. 4, the transparent conductive layer 3 may also include the two third grain boundaries 9 in which the other end edges are open to the second main surface 6, and a fourth crystal grain 34 partitioned by the intermediate region 25 of the first grain boundary 7. The intermediate region 25 includes the two second branch points 27.

The fourth crystal grain 34 does not face the one-side surface 56 and the first main surface 5, and faces only the second main surface 6.

Figure 5:
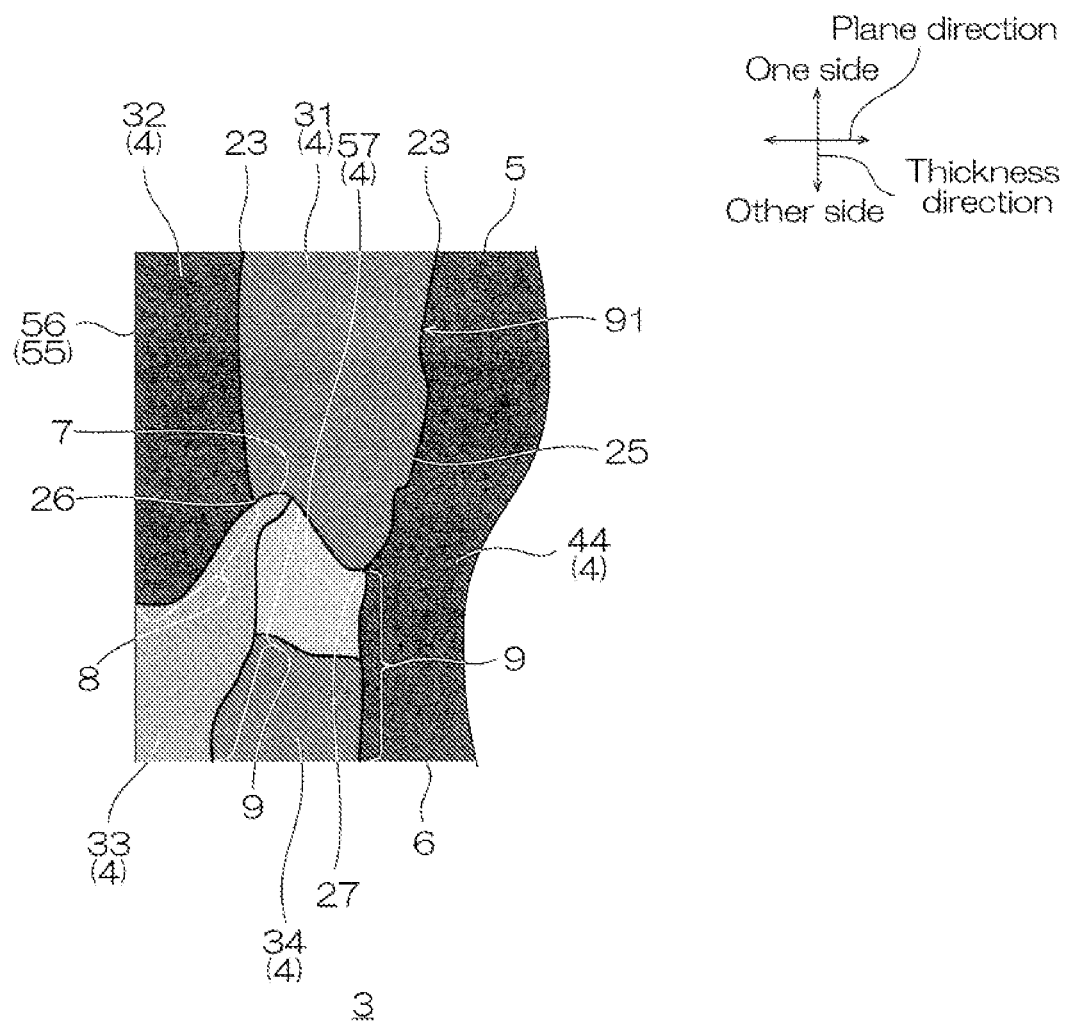
FIG. 5 shows a cross-sectional view of a modified example (modified example including a fifth crystal grain not facing any of a first main surface, a second main surface, and a side surface) of a transparent conductive layer of the present invention.

Further, as shown in FIG. 5, a fifth crystal grain 57 which does not face any of the first main surface 5, the second main surface 6, and the side surface 55 may be also provided.

Figure 6:
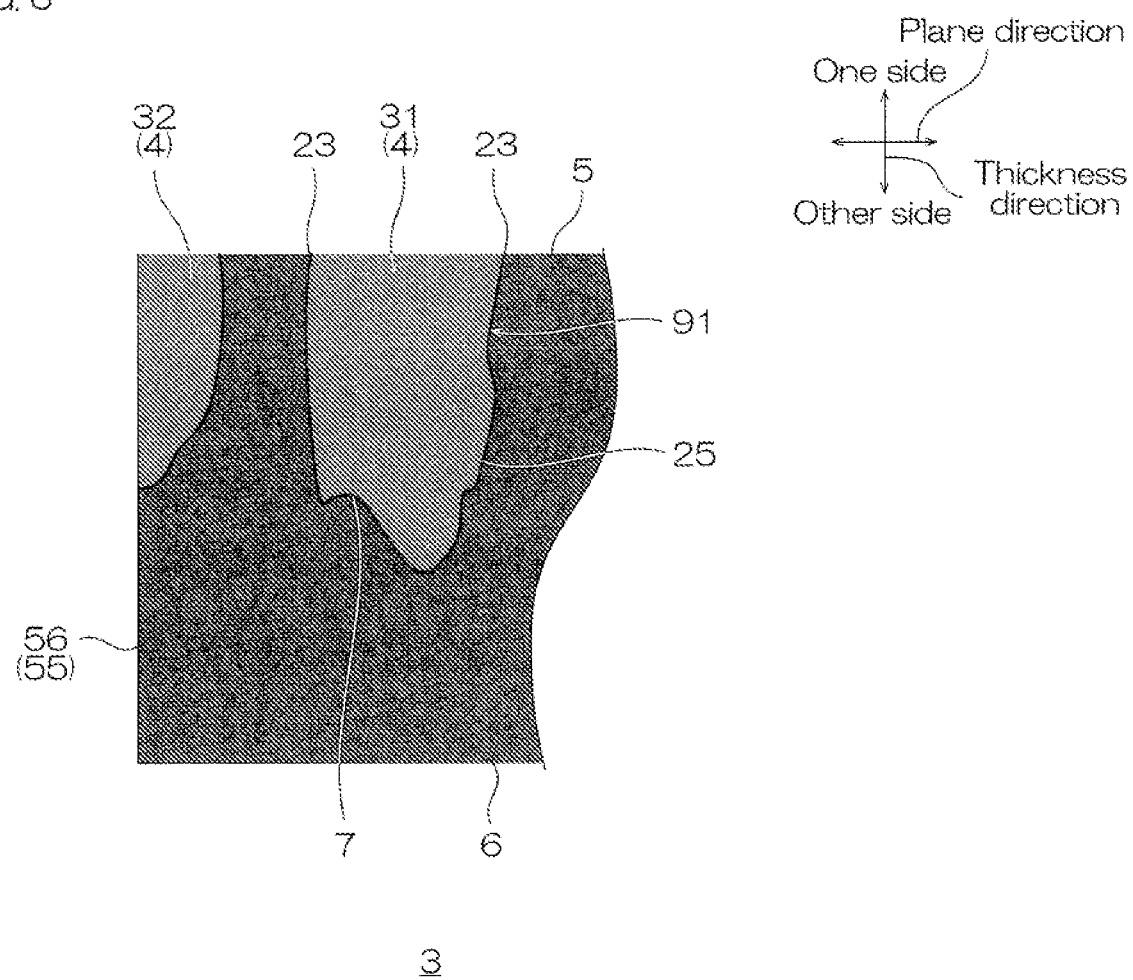
FIG. 6 shows a cross-sectional view of a modified example (modified example in which a first grain boundary does not include a branch point) of a transparent conductive layer of the present invention.

As shown in FIG. 6, the transparent conductive layer 3 does not have the above-described third crystal grain 33 and the above-described fourth crystal grain 34 (ref: FIG. 4), that is, has only the crystal grain 4 which does not face the second main surface 6, that is, has only the first crystal grain 31. In this case, the intermediate region 25 does not include the first branch point 26 and the second branch point 27 (ref: FIG. 4).

Preferably, as in one embodiment, the intermediate region 25 includes the second branch point 27 and the transparent conductive layer 3 includes the third grain boundary 9. Thus, when the etching solution enters the third grain boundary 9 from the second branch point 27, and reaches the second main surface 6, the missing of the third crystal grain 33 is promoted. Therefore, it is possible to further increase the etching rate.

Figure 7:
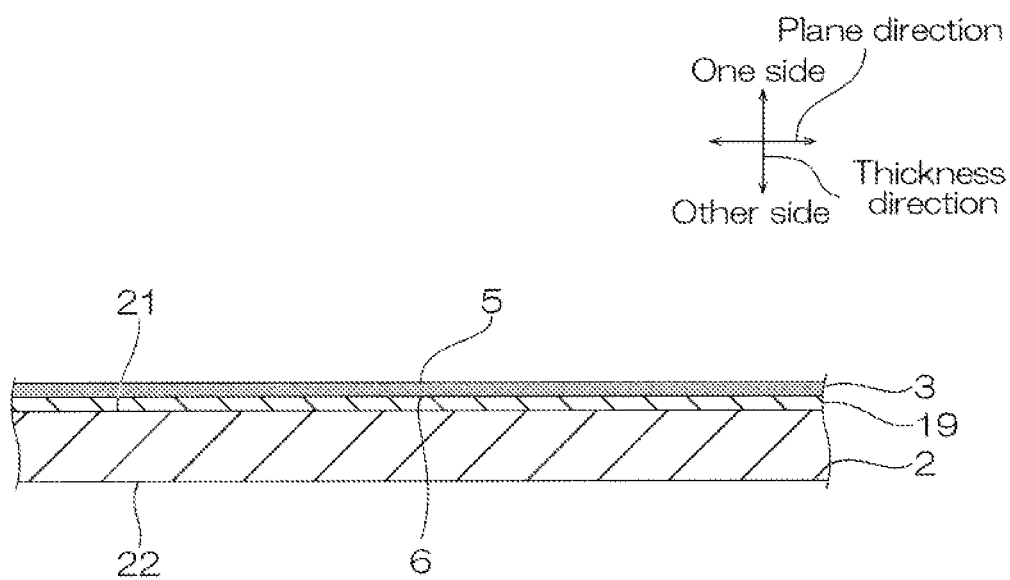
FIG. 7 shows a cross-sectional view of a modified example (modified example including a functional layer) of a transparent conductive sheet of the present invention.
Figure 8:
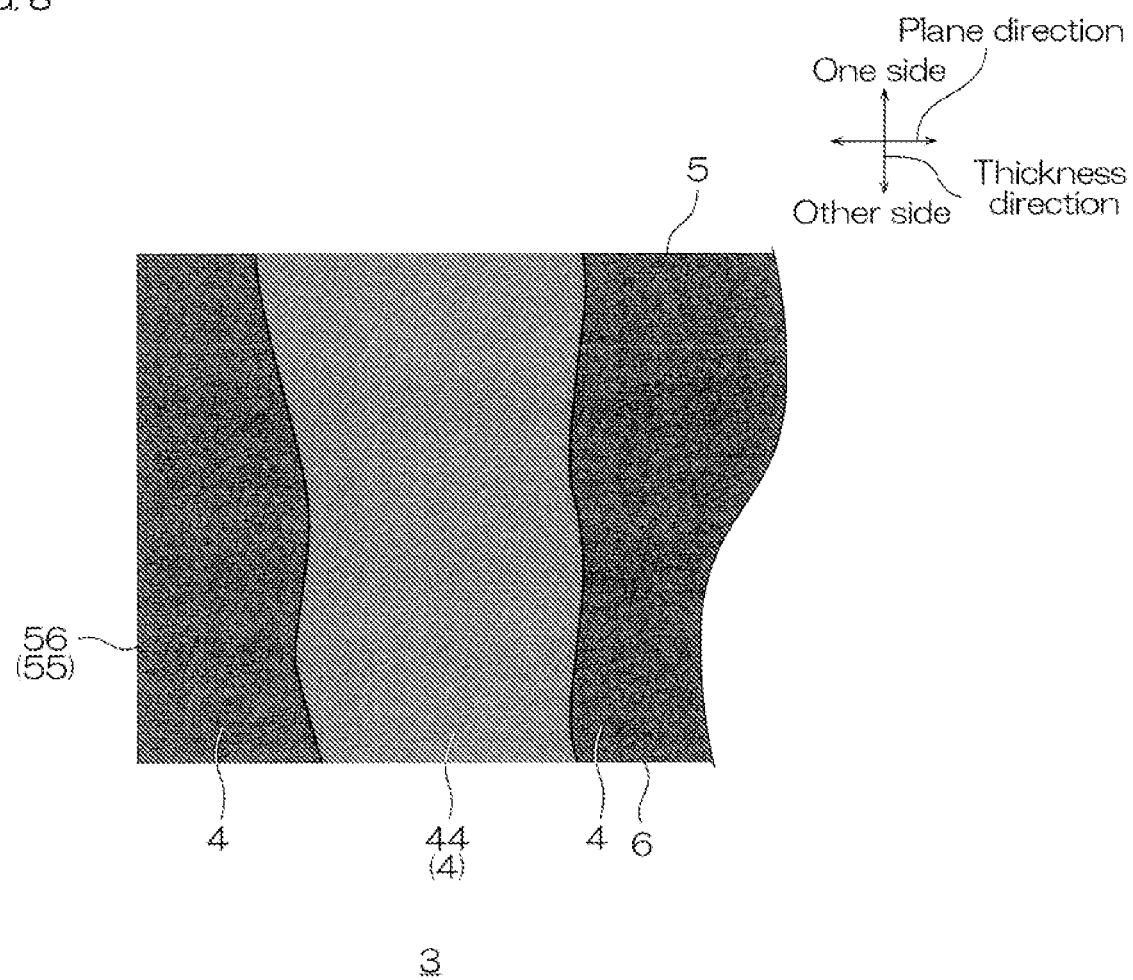
FIG. 8 shows a cross-sectional view of a transparent conductive layer without including a first crystal grain in a transparent conductive sheet of Comparative Examples 1 and 2.

As shown in FIG. 7, the transparent conductive sheet 1 may further include a functional layer 19 located between the substrate sheet 2 and the transparent conductive layer 3. The functional layer 19 is in contact with the second main surface 6 and the substrate first main surface 21. Examples of the functional layer 19 include anti-blocking layers, optical adjustment layers, hard coat layers, and release functional layers. The functional layer 19 is a single layer or a plurality of layers. The functional layer 19 may include any of inorganic materials, organic materials, and composite materials of organic materials and inorganic materials as a constituent material.

Although not shown, the transparent conductive layer 3 may be also peeled off from the transparent conductive sheet 1 including a peeling functional layer as the functional layer 19 between the substrate sheet 2 and the transparent conductive layer 3. The peeled transparent conductive layer 3 may be used, for example, by transfer and attachment to another member constituting the touch sensor.

In the sputtering device 30, though not shown, it is also possible to use a flat film-forming plate extending in the plane direction instead of the film-forming roll 40. The plurality of targets 41 to 42 are disposed in parallel at spaced intervals to the film-forming plate.

EXAMPLES

Next, the present invention is further described based on Example and Comparative Examples below. The present invention is however not limited by Example and Comparative Examples. The specific numerical values in mixing ratio (content ratio), property value, and parameter used in the following description can be replaced with upper limit values (numerical values defined as "or less" or "below") or lower limit values (numerical values defined as "or more" or "above") of corresponding numerical values in mixing ratio (content ratio), property value, and parameter described in the above-described "DESCRIPTION OF EMBODIMENTS".

Example 1

First, a PET film roll (manufactured by Mitsubishi Plastics, Inc., thickness of 50 μm) was prepared. Then, an ultraviolet curable resin made of an acrylic resin was applied to the upper surface of the PET film roll and cured by ultraviolet irradiation, thereby forming a functional layer consisting of a cured resin layer and having a thickness of 2 μm. Thus, the substrate sheet 2 including the transparent substrate and the functional layer was obtained.

Thereafter, the transparent conductive layer 3 having a thickness of 155 nm was formed on the functional layer surface of the substrate sheet 2 by sputtering.

Specifically, first, the sputtering device 30 including the first target 41 made of ITO having the tin oxide concentration of 10% by mass and the second target 42 made of ITO having the tin oxide concentration of 3% by mass was prepared, and the substrate sheet 2 was bridged over the feeding roll 38, the film-forming roll 40, and the take-up roll 39 of the sputtering device 30.

Subsequently, by driving the cooling device, the surface temperature of the film-forming roll 40 was cooled to −8° C.

Further, the plurality of pumps 50 were driven to bring the first film-forming chamber 51 to the second film-forming chamber 52 into a vacuum state (under a reduced pressure atmosphere) of 0.4 Pa, and a reactive gas was supplied from each of the first gas feeder 61 to the second gas feeder 62 to each of the first film-forming chamber 51 to the second film-forming chamber 52 at the flow ratio (oxygen gas flow rate/argon gas flow rate) described in Table 1.

Further, by driving the take-up roll 39, the substrate sheet 2 was fed from the feeding roll 38.

Then, the sputtering was carried out in each of the first film-forming chamber 51 to the second film-forming chamber 52.

Thus, the amorphous transparent conductive layer 28 having the first region 71 to the second region 72 was formed on the substrate first main surface 21 of the substrate sheet 2. Thus, the amorphous transparent conductive sheet 29 including the substrate sheet 2 and the amorphous transparent conductive layer 28 was obtained.

Thereafter, the amorphous transparent conductive sheet 29 was heated at 165° C. for 120 minutes under an atmospheric atmosphere, thereby crystallizing the transparent conductive layer 3 (the amorphous transparent conductive layer 28). Thus, the transparent conductive sheet 1 including the substrate sheet 2 and the transparent conductive layer 3 was produced.

Comparative Examples 1 to 2

The process was carried out in the same manner as in Example 1, except that the film-forming conditions and the thickness of the transparent conductive layer 3 were changed in accordance with the description of Table 1.

<Evaluation>

The following items were evaluated for each of the transparent conductive layers 3 of Example and Comparative Examples. The results are shown in Table 1.

[Thickness of Transparent Conductive Layer]

The thickness of the transparent conductive layer 3 was determined by cross-sectional observation using a transmission electron microscope (manufactured by Hitachi, Ltd., device name: "HF-2000").

[Cross-Sectional Observation of Crystal Grain]

After the transparent conductive sheet 1 of Example 1 and Comparative Examples 1 to 2 was cross-sectionally adjusted by an FIB micro-sampling method, the cross-section of each of the transparent conductive layers 3 was subjected to FE-TEM observation, and a presence or absence of the second grain boundary 8 was observed. The magnification was set so that any crystal grain 4 could be observed.

The device and the measurement conditions are as follows.

FIB device: FB2200 manufactured by Hitachi, Ltd., acceleration voltage: 10 kV

FE-TEM device: JEM-2800 manufactured by JEOL Ltd., acceleration voltage: 200 kV

As a result, in Example 1, the first crystal grain 31 was observed. In addition, the second crystal grain 32, the third crystal grain 33, and the fourth crystal grain 44 were observed.

On the other hand, in Comparative Examples 1 and 2, the first crystal grain 31 was not observed, while only the fourth crystal grain 44 was observed.

[Maximum Crystal Grain Size of Crystal Grain in First Main Surface]

The surface of the transparent conductive layer 3 was observed in the plane direction from the side of the first main surface 5 by surface FE-SEM, and the maximum crystal grain size of the crystal grain 4 in the first main surface 5 was determined.

SEM device: manufactured by Hitachi High-Technologies Corporation, scanning electron microscope SU8020

Acceleration voltage: 0.8 kV

[Etching Rate of Transparent Conductive Layer]

Each of the transparent conductive sheets 1 of Example and Comparative Examples was immersed in hydrochloric acid having the concentration of 7% by mass at 35° C., and then, washed with water and dried, and the resistance between terminals between 15 mm was measured with a tester (measurement period with the tester was set every 15 seconds). In the specification, after the immersion in the hydrochloric acid, the water washing, and the drying, the time when the resistance between the terminals between 15 mm was above 50 kΩ and becomes insulated was defined as the time when the etching of the transparent conductive layer 3 was completed. Then, the time (etching rate (sec/nm)) required for etching the transparent conductive layer 3 by 1 nm was determined by dividing the obtained time by the total thickness of the transparent conductive layer 3, and the evaluation was carried out based on the following criteria. By this evaluation, the etching rate of the transparent conductive layer 3 can be determined without depending on the thickness of the transparent conductive layer 3.

Excellent: The etching time per unit thickness was below 15 (sec/nm).

Bad: The etching time per unit thickness was 15 (sec/nm) or more.

TABLE 1

| Ex. Comp. Ex. | First to Second | Pressure of Film-Forming Chamber (Pa) | Temperature of Film-Forming Roll (° C.) | Flow Ratio of Sputtering Gas ($O_2$ Flow Rate/Ar Flow Rate) | Thickness (nm) | Presence or Absence of First Crystal Grain | Maximum Crystal Grain (nm) | Etching Rate (Etching Time per Unit Thickness) |
|---|---|---|---|---|---|---|---|---|
| Ex. 1 | First | 0.4 | −8 | 0.009 | 155 | Presence | 210 | Excellent |
|  | Second | 0.4 |  | 0.002 |  |  |  |  |
| Comp. Ex. 1 | First | 0.2 | 80 | 0.031 | 23 | Absence | 580 | Bad |
|  | Second | 0.2 |  | 0.031 |  |  |  |  |
| Comp. E. 2 | First | 0.4 | 30 | 0.000*[1] | 24 | Absence | 400 | Bad |
|  | Second | 0.4 |  | 0.000*[1] |  |  |  |  |

*[1]Sputtering gas does not include oxygen, and includes only argon.

While the illustrative embodiments of the present invention are provided in the above description, such is for illustrative purpose only and it is not to be construed as limiting the scope of the present invention. Modification and variation of the present invention that will be obvious to those skilled in the art is to be covered by the following claims.

INDUSTRIAL APPLICATION

The transparent conductive layer of the present invention is, for example, used for a transparent conductive sheet, a touch sensor, a light control element, a photoelectric conversion element, a heat ray control member, an antenna, an electromagnetic wave shield member, and an image display device.

DESCRIPTION OF REFERENCE NUMERALS

1 Transparent conductive sheet
2 Substrate sheet
3 Transparent conductive layer
4 Crystal grain
5 First main surface
6 Second main surface
8 Second grain boundary
23 End edge
25 Intermediate region
31 First crystal grain
55 Side surface
56 One-side surface

The invention claimed is:

1. A laminate comprising: a substrate sheet or a functional layer; and a transparent conductive layer,
wherein the transparent conductive layer includes a first main surface which is exposed to atmosphere, and a second main surface opposite to the first main surface in a thickness direction and in direct contact with one surface in the thickness direction of the substrate sheet or functional layer, the transparent conductive layer is a single continuous layer extending in a plane direction perpendicular to the thickness direction, the transparent conductive layer has a grain boundary in which two end edges in a cross-sectional view are open to the first main surface, and an intermediate region between both end edges is not in contact with the second main surface, the transparent conductive layer has a first crystal grain partitioned by the grain boundary and facing only the first main surface, the substrate sheet consists of at least one selected from the group consisting of polyester resin, (meth)acrylic resin, olefin resin, polycarbonate resin, polyether sulfone resin, polyarylate resin, melamine resin, polyamide resin, polyimide resin, cellulose resin, polystyrene resin, and norbornene resin, and the functional layer includes an organic material.

2. The laminate according to claim 1,
wherein the transparent conductive layer further has a second grain boundary open to a side surface connecting an end edge of the first main surface to an end edge of the second main surface.

3. The laminate according to claim 1, wherein a material for the transparent conductive layer is a tin-containing oxide.

4. A touch sensor comprising:
the laminate according to claim 1.

5. A light control element comprising:
the laminate according to claim 1.

6. A photoelectric conversion element comprising:
the laminate according to claim 1.

7. A heat ray control member comprising:
the laminate according to claim 1.

8. An antenna comprising:
the laminate according to claim 1.

9. An electromagnetic wave shield member comprising:
the laminate according to claim 1.

10. An image display device comprising:
the laminate according to claim 1.

* * * * *